United States Patent
Hortaleza

(10) Patent No.: US 6,686,291 B1
(45) Date of Patent: Feb. 3, 2004

(54) UNDERCUT PROCESS WITH ISOTROPIC PLASMA ETCHING AT PACKAGE LEVEL

(75) Inventor: Edgardo R. Hortaleza, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1057 days.

(21) Appl. No.: 08/859,407

(22) Filed: May 20, 1997

Related U.S. Application Data

(60) Provisional application No. 60/018,289, filed on May 24, 1996.

(51) Int. Cl.$^7$ ................................................ H01L 71/20
(52) U.S. Cl. ........................ 438/710; 438/51; 438/57; 438/67; 438/107; 438/110
(58) Field of Search ............................. 438/51, 57, 67, 438/107, 110, 50

(56) References Cited

U.S. PATENT DOCUMENTS

| | | | | |
|---|---|---|---|---|
| 3,641,661 A | * | 2/1972 | Canning et al. ............... | 438/6 |
| 3,750,269 A | * | 8/1973 | Small ........................... | 438/6 |
| 3,771,217 A | * | 11/1973 | Hartman ........................ | 438/6 |
| 4,855,544 A | * | 8/1989 | Glenn ..................... | 200/61.48 |
| 5,061,049 A | | 10/1991 | Hornbeck .................... | 359/224 |
| 5,331,454 A | | 7/1994 | Hornbeck .................... | 359/224 |
| 5,389,182 A | | 2/1995 | Mignardi .................... | 156/344 |
| 5,393,706 A | | 2/1995 | Mignardi et al. ........... | 437/226 |
| 5,435,876 A | | 7/1995 | Alfaro et al. ............... | 156/247 |
| 5,445,559 A | | 8/1995 | Gale et al. .................. | 451/388 |
| 5,535,047 A | | 7/1996 | Hornbeck .................... | 359/295 |
| 5,595,940 A | * | 1/1997 | Trah et al. ..................... | 438/50 |
| 5,597,767 A | | 1/1997 | Mignardi et al. ........... | 437/227 |
| 5,610,438 A | | 3/1997 | Wallace et al. ............. | 257/682 |

* cited by examiner

*Primary Examiner*—Robert Kunemund
(74) *Attorney, Agent, or Firm*—Charles A. Brill; Wade James Brady, III; Frederick J. Telecky, Jr.

(57) ABSTRACT

A method (30) of fabricating a micromechanical device (10) by performing spacer layer undercutting (46) and passivation at the package level. A back-end assembly process utilizes a full-cut saw process to separate the partially fabricated micromechanical devices. The individual die are then attached by pick and place equipment to a lead frame and are wire bonded, before the die are undercut. This technique avoids the generation of any particles from becoming lodged under movable structure during the cut process, and further, reduces the susceptibility of the die to damage or particles generated during the pick and place process.

6 Claims, 2 Drawing Sheets

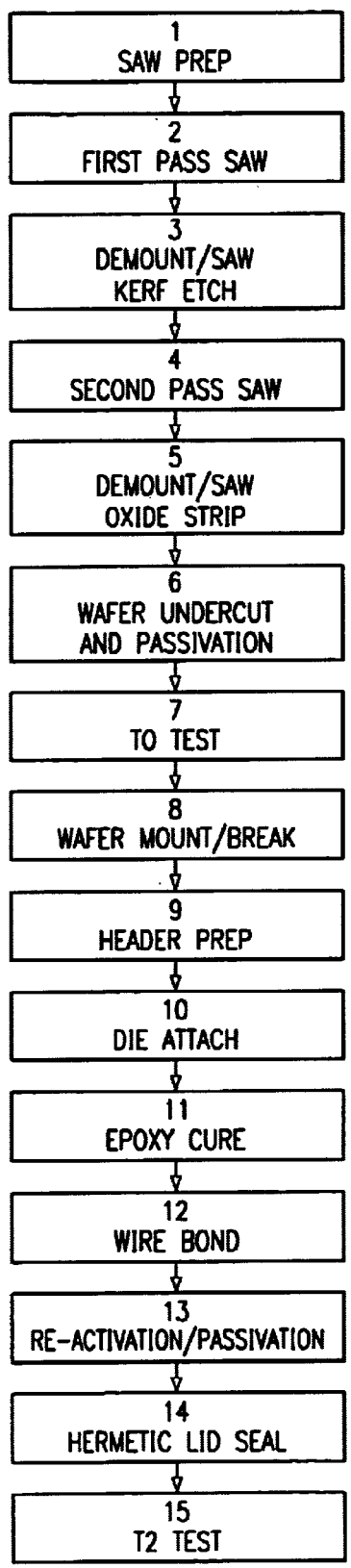
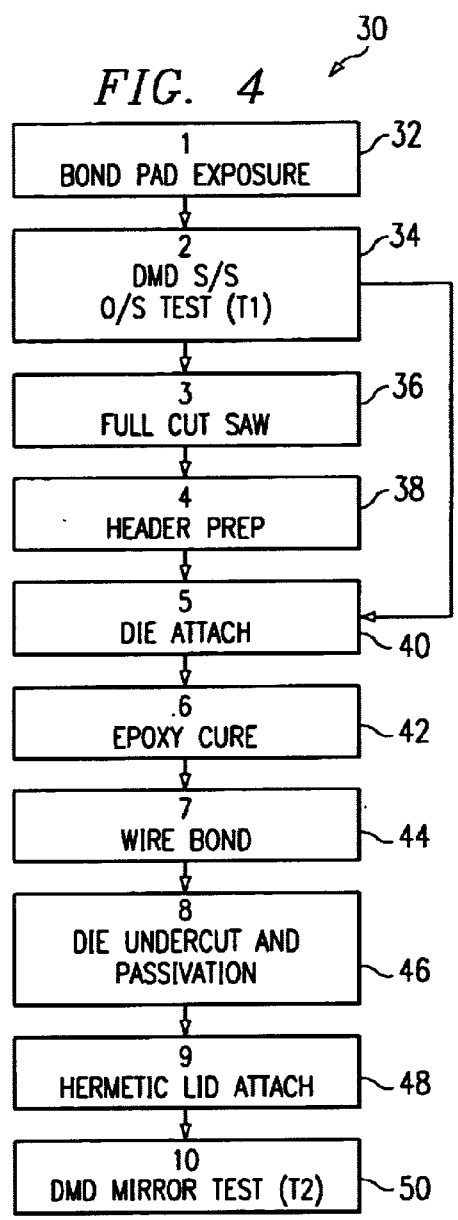

UNDERCUT PROCESS WITH ISOTROPIC PLASMA ETCHING AT PACKAGE LEVEL

This application claims the benefit of Provisional Application No. 60/018,289, filed May 24, 1996.

CROSS REFERENCE TO RELATED APPLICATIONS AND PATENTS

| SERIAL NO./ PATENT NO. | TITLE | DATE FILED/ DATE ISSUED |
|---|---|---|
| 5,597,767 | Separation of Wafer into Die with Wafer-Level Processing | ISSUED 01/28/97 |
| 5,610,438 | Micro-Mechanical Device | ISSUED 03/11/97 |
| 60/015,107 | Manufacturing Process of Digital Micromirror Device | 04/11/96 |
| 60/016,732 | Method of Reducing Wafer Particles After Partial Saw | 05/02/96 |

FIELD OF THE INVENTION

The present invention relates to the protection of active sites on a semiconductive wafer which is sawed into individual active-site-bearing chips, and more particularly to a method of protecting, during and after sawing, active sites such as micromechanical devices from debris and deleterious substances which are produced by, or are used in, such sawing.

BACKGROUND OF THE INVENTION

Numerous processes are known for producing plural arrays of active sites in and on a first surface of a semiconductor wafer. Each active site may comprise a micromechanical device having deflectable elements such as a digital micromirror device (DMD) such as that manufactured by Texas Instruments of Dallas Tex., but could also include accelerometers, sensors etc. The wafer is ultimately separated into a plurality of individual chips, also known as dies or bars, each of which includes one of the active site arrays, the array having a "top" surface comprising a portion of what was formerly the wafer's first surface. Each active site array has associated therewith one or more bond pads on its top surface. The bond pads are rendered selectively electrically continuous with the active sites, typically by depositing or otherwise forming them on top of, and in electrical contact with, conductors formed on the wafer. Some of the same steps used to produce the active sites may also produce the conductors, which are themselves electrically continuous with the active sites.

The separation of the wafer into individual chips is effected by an operation which may be referred to as "complete sawing", or "partial sawing" followed by a "breaking" process. Sawing separates the wafer along lines or paths commonly referred to as "streets" extending between locations whereat adjacent active site arrays reside or will ultimately reside.

Sawing, which typically involves mechanical abrasion and erosion of the wafer, may be achieved by a number of techniques, including those which utilize rotating saw blades and vibrating tips. Accordingly, the act of sawing the wafer itself produces substantial debris which includes small pieces of the wafer including oxide particles from a CMOS layer, and possibly small pieces of the saw blade or vibrating tip. Sawing is also typically accompanied by cooling/lubricating fluids and other substances which prevent the saw blade or tip from damaging the wafer and which prolong the life of the saw blade or tip.

The debris resulting from and the substances used in sawing can degrade the performance of or render inoperative the active sites, particularly moving parts of a micromechanical device. If the active sites include a spatial light modulator ("SLM"), such as that known as a deflectable mirror device or a digital micromirror device (collectively "DMD"), each active site may be even more sensitive to the effects or presence of the debris and fluids resulting from and used in sawing.

A DMD is a multilayered micromechanical structure formed on a wafer, which includes a light-reflective beam or similar mechanical member. An example of a DMD is disclosed in commonly assigned U.S. Pat. No. 5,061,049 entitled "Spatial Light Modulator and Method", the teachings incorporated herein by reference. An area or linear array of beams are associated with an active site and are so mounted to, or hinged from, the structure formed on the wafer as to be deflectable or movable between a normal position and other positions. Deflection of the beam may be achieved by electrostatically attracting the beam toward (or to) an underlying adjacent electrode which is at a different electrical potential from that of the beam. Deflection of the beam stores energy in its mount or hinge, which stored energy tends to return the beam to its normal position absent the electrical potential. Movement of the beam, which may be binary or analog, is controlled by the circuit components of the active site associated with the beam and functioning as an addressing circuit. Deflection of the beam is facilitated by an undercut well which underlies the beam. The well is formed by appropriate etching of one of the spacer layers of material deposited on the wafer, typically comprising photoresist.

In use, an array or matrix of DMD's is arranged to receive light from a source. The received light which is incident on the reflective beams is selectively reflected or not reflected onto a viewing surface, such as a screen, depending on the position of the beams. Such reflected light is directed by each beam onto the viewing surface in only one selected position, which may be the normal position or one of the other deflected positions. In all other positions of each beam other than the selected position, the incident, reflected light is directed in such a way that it does not fall on the viewing surface, such as to a light absorber. Appropriate energization of the circuit components of the addressing circuit associated with each beam of each active site in the array or matrix permits the beam-reflected light on the viewing surface to be presented as a rasterized array of pixels (as in a typical television) or as a scanning line of pixels (as in a line printer). Thus, the beam of each active site is or acts as a pixel.

Because a DMD includes circuit components as well as a microminiature deflectable beam, it is especially sensitive to debris resulting from sawing the wafer and to the fluids and other substances used to facilitate sawing. Such debris can enter the undercut well and prevent deflection of the beam. In one technique, formation of the circuit components of the active sites and etching or other steps which define the beams are followed by the deposit of a protective layer thereon. Sawing of the wafer to separate the arrays then proceeds, the protective layer preventing the sawing operation from damaging the circuit components and the etch-defined beams. After sawing is completed, but while still in wafer form, the protective layer is removed and the undercut wells are then formed under each beam by plasma etching the spacer layer. Formation of the wells at this time reduces the sawing-related debris and substances from entering the wells. However, automatic pick-and-place equipment and other automatic or human handling can still generate damaging particles until the DMD device is secured to and finally hermetically sealed in the package.

One object of the present invention is the provision of a method of protecting each active site in plural active site arrays on a fully processed semiconductor wafer, particularly active sites which include a DMD SLM or other micromachine, so that beam-defining etching and well formation may all be carried out with reduced particles inhibiting operation of the device before it is hermetically sealed in a package.

In commonly assigned U.S. Pat. No. 5,389,182 to Mignardi entitled "Use of a Saw Frame with Tape as a Substrate Carrier for Wafer Level Backend Processing", there is disclosed a method for processing a wafer containing microelectronic mechanical devices. The method allows all fabrication and test steps to be performed in wafer form upon a dicing tape, whereby the wafer is completely sawn to separate the devices from one another, but wherein the devices are left on the dicing tape during the remaining fabrication steps including device testing and undercutting of the spacer layer beneath the mirrors.

In commonly assigned U.S. Pat. No. 5,393,706 to Mignardi, et al entitled "Integrated Partial Sawing Process", there is disclosed a process for partially sawing streets on a semiconductor wafer, and then covering the streets with a protective material. After the wafer is broken to separate the die from one another, the protective material may or may not be removed. The protective material over the streets traps any debris from the break and prevents it from contaminating the active parts of the micromechanical device. The tape is then peeled away, and the chips are removed by standard semiconductor machines which handle picking and placing of individual chips. The sacrificial layer of photoresist is removed before wafer break, thereby allowing the active elements or micromirrors to move freely.

In commonly assigned U.S. Pat. No. 5,435,876 to Alfaro, et al entitled "Grid Array Masking Tape Process", there is disclosed a method of adhering a tape with an adhesive grid to the partially fabricated wafer. This tape encapsulates each active site beneath a non-adherent protective envelope. The adhesive portions of the tape are registered with the saw streets of the wafer.

In commonly assigned U.S. Pat. No. 5,445,559 to Gale, et al entitled "Wafer-like Processing after Sawing DMD's", there is disclosed a processing fixture and method of fabricating micromechanical devices whereby the wafer is attached to a vacuum fixture after partially sawing the wafer to create saw kerfs. The backside of the wafer is ground down to the saw kerfs to separate the devices. Each device is held on the fixture by a vacuum in the head space above the device. In an alternative embodiment, the devices are separated by sawing completely through the wafer while in the fixture.

In commonly assigned U.S. Pat. No. 5,597,767 to Mignardi, et al entitled "Separation of Wafer Into Die with Wafer-Level Processing", there is disclosed a two-step die separation process that permits intervening wafer-level processing. Separation lines are inscribed on the top surface of the substantially fabricated wafer. During the inscription step, a protective coating on the wafer protects the top surface of the wafer. The protective layer is then removed after inscription, and the wafer is processed with at least one wafer-level process. This invention allows backend processing and testing to be performed at the wafer level rather than die-by-die.

In commonly assigned U.S. Patent Application Serial No. 60/015,107 entitled "Method of Cleaning Wafer After Partial Saw", there is disclosed a method of performing a partial-saw to the wafer to form kerfs between the partially fabricated micromechanical devices, whereby a solution of an alkyl glycol and hydrofluoric acid is utilized to clean up debris generated by the partial saw process.

In commonly assigned U.S. Patent Application Serial No. 60/016,732 entitled "Method of Reducing Wafer Particles After Partial Saw", there is disclosed a method of utilizing compatible layers of photoresist to avoid the generation of microscopic cracks within the layers of photoresist. A very strong hydrofluoric acid can be utilized during the wet clean-up process to remove debris generated during the partial-saw process.

There is desired a method of fabricating and packaging a micromechanical device with reduced particles, while still permitting wafer-level processing to be performed.

SUMMARY OF THE INVENTION

The method of the present invention achieves technical advantages by mounting partially fabricated micromechanical devices on a package, and performing the spacer layer undercutting at package level, just prior to attaching a lid to the package. The process of the present invention utilizes wafer-level processing and reduces the chance of particles damaging the device by waiting to undercut the spacer layer until just before the lid is attached to the package. Conventional wafer-level processing is performed up to the point that the partially fabricated devices are separated from one another at the wafer level and then picked and placed on the packages. The present invention avoids any function-inhibiting particles being generated, such as when the devices are undercut after a complete break while still remaining on a wafer tape, but before they are picked and placed on the package.

The present invention comprises a method of fabricating a micromechanical device including the steps of processing a wafer to form a plurality of partially fabricated devices. The devices have a micromechanical structure defined upon a first layer. Thereafter, the wafer is subdivided to separate the partially fabricated devices. Next, these partially fabricated devices are mounted on a package with the first layer still in place. Next, the mounted partially fabricated devices are undercut to remove the first layer from the devices to free the micromechanical structure for movement. Finally, a lid is attached to the package.

Preferably, the undercutting process is performed by a direct isotropic plasma etch process, such as using $NF_3$. This first layer preferably comprises a photoresist material, preferably being UV-cured. The present invention preferably further comprises the step of performing a wire bond between the package and the mounded partially fabricated device before the undercut process. In addition, the device may be passivated after the undercut process before the lid is attached to inhibit sticking between engaging elements. In the preferred embodiment of the present invention, the micromechanical device comprises a beam and a hinge, whereby the hinge supports the beam above a well after the undercutting process. The micromechanical device may be a DMD, although the present invention is also suitable for other micromechanical devices including accelerometers, sensors, and so forth.

BRIEF DESCRIPTION OF THE DRAWINGS

FIG. 3 is a conventional process flow whereby the wafer is undercut to remove the spacer layer and free the micromirrors of a DMD device prior to the wafer break and the die attach steps; and FIG. 4 is a process according to the preferred embodiment of the present invention whereby the partially fabricated micromechanical die are separated from one another by a complete saw or break of the wafer, and whereby the undercutting process is performed after the die are attached to the package, preferably after the wire bond process.

DETAIL DESCRIPTION OF THE PREFERRED EMBODIMENT

Figure 1:
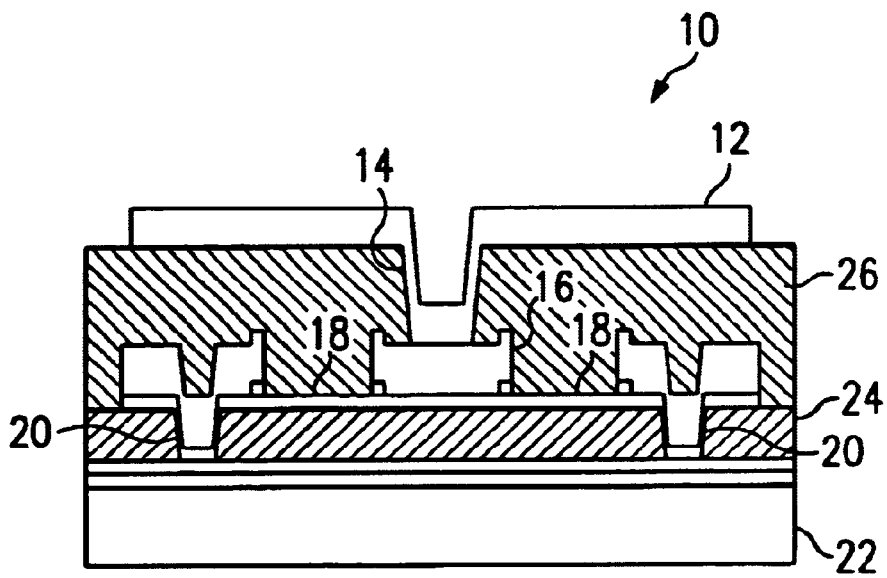
FIG. 1 is a sectional side view of a partially-fabricated micromechanical device formed on a wafer and having at least one spacer layer still in place.
Figure 2:
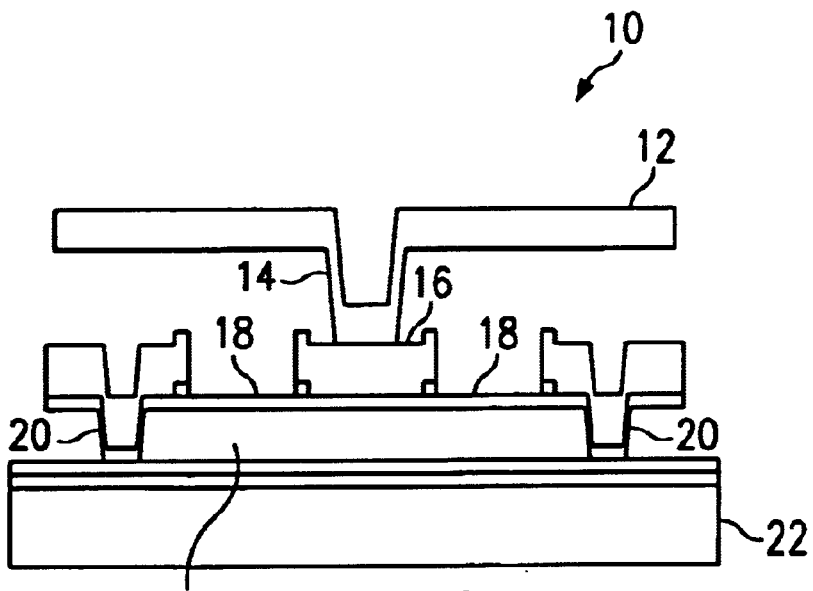
FIG. 2 is the sectional side view of FIG. 1 with the spacer layers undercut to allow freedom of movement of the beam.

Referring first to FIG. 1, there is shown generally at 10 one partially fabricated DMD micromechanical device. Device 10 includes a deflectable 16 micron-square mirror 12 supported by a mirror post 14 upon a yoke 16. Yoke 16, in turn, is supported by a torsion hinge 18 suspended between a pair of posts 20 fabricated upon a silicon wafer 22. The structures are separated from one another by a first spacer layer 24 comprised of UV-cured photoresist, and a second photoresist spacer layer 26. FIG. 2 shows the device 10 of FIG. 1 whereby the photoresist spacer layers 24 and 26 are removed, preferably by a plasma undercut process to form a well 28 beneath hinges 18 and yoke 16, freeing the structure for rotation about the torsion axis above well 28. Devices 10 are typically fabricated as an area or linear array to form a spatial light modulator. For a more detailed discussion of such DMD devices 10, cross-reference is made to commonly assigned U.S. Pat. No. 5,536,047 entitled "Active Yoke Hidden Hinge Digital Micromirror Device", the teachings of which are incorporated herein by reference.

Now, first referring to FIG. 3, there is shown one conventional method of performing back-end processing of a micromechanical device, whereby the photoresist spacer layers are undercut to form wells 28 prior to wafer break, and after a partial saw process.

Referring now to FIG. 4, there is generally shown at 30 a method of performing back-end assembly of a partially fabricated micromechanical device according to the preferred embodiment of the present invention. For purposes of illustration and clarity, but without limitation thereto, the present invention is set forth as fabricating a micromechanical device of the DMD-type such as that manufactured by Texas Instruments of Dallas Tex. One detailed description of DMDs is explained in commonly assigned U.S. Pat. No. 5,061,049 entitled "Spatial Light Modulator and Method", the teachings of which are incorporated herein by reference. As described in the aforementioned patent, DMDs have a deflectable micromirror suspended over an air gap and above address electrodes formed on the surface of a silicon substrate. To ultimately form a suspended micromirror above the address electrode the underlying photoresist spacer layer formed during the front-end processing needs to be removed, but whereby the generation of particles which can inhibit the operation of the deflectable micromirror needs to be avoided until the die can be hermetically sealed in a package.

The present invention sets forth to implement conventional wafer-level processing techniques, yet substantially reduce the generation of particles which can inhibit the operation of the DMD device.

The present invention is directed to the back-end assembly of a partially fabricated micromechanical device, such as the device disclosed in commonly assigned U.S. Pat. No. 5,061,049, the teachings of which are incorporated herein by reference. During the front-end process, a plurality of partially fabricated micromechanical devices are formed on a silicon wafer substrate by sequentially applying and patterning metal layers and photoresist spacer layers upon the substrate, which has already been processed to form a CMOS layer including logic, SRAM cells and address electrodes. During the front-end assembly, the superstructures of the micromechanical devices including posts, hinges, yokes and mirrors are fabricated. These structures are patterned and separated above the substrate by a series of photoresist spacer layers, also referred to as sacrificial layers.

Referring to FIG. 4, in view of FIGS. 1 and 2, the process of the present invention begins at step 32 where the bond pads of the partially fabricated micromechanical devices 10 just described are exposed. This is done by selectively etching off the photoresist to open the bond pads (not shown) defined about the perimeter of each individual partially fabricated micromechanical device formed on the wafer.

At step 34, each of the DMD superstructures is tested whereby opens and shorts are detected. As the micromirrors 12 are not yet deflectable and still in wafer form, the partially fabricated micromechanical devices are only preliminarily checked for functionality, with those devices deemed defective being identified and either rechecked after mounting on the package, or labeled to be discarded after being separated from one another during the wafer saw process and/or break process.

At step 36, a full saw cut is performed to the wafer on a saw frame to separate the partially fabricated micromechanical devices from one another. The cut between the die is perpendicular to the wafer surface and does not require a beveled edge, thus a blade having a moderate cost can be utilized. In addition, the surface area of the exposed oxide layer adjacent the cut is minimized by a perpendicular cut, which reduces the generation of oxide particles during the cut.

At step 38, a header is prepared on a lead frame package using a scribe. A marker pen is utilized which generates minimum particles to mark the back of the package with the lot number, wafer number and die number of the clip to be attached to the package.

At step 40, each of the die are attached to a lead frame package. Conventional pick and place equipment is utilized to pick the die from the saw frame and place the die upon the lead frames which have been prepared with a small quantity of curable epoxy. Vacuum pressure is typically employed to handle the die. It is noted that at this step the sacrificial photoresist spacer layers 24 and 26, as well as a protective photoresist layer (not shown) coating the devices remain in the die and the micromechanical mirrors 12 are not yet free to rotate. Thus, the dies are more forgiving to scratches or particles that may be generated by the pick and place equipment and other human handling since the mirrors are still protected with the top layer of protective material. In addition, shorting of the mirrors to the address electrodes by particles is not possible.

At step 42, the die adhesive epoxy is cured, preferably by a UV-process. Again, since the photoresist sacrificial spacer layers are still in place, the present invention offers more protection against possible epoxy outgassing.

At step 44, the wire bond process is performed whereby the die bond pads are connected to the leads of the package using low temperature bonding techniques.

Next, at step 46, all of the photoresist spacer layers, including layers 24 and 26, of the singular packages are undercut using a top level isotropic plasma etch process. Notably, this undercutting process is performed to each of the die after it is attached to the lead frame package. Thus, there is no subsequent handling which may generate particles after the micromirrors have been freed above their wells and are free to rotate. Preferably, this undercutting process is performed by placing the individual die-attached packages in a plasma etch reactor identified as model #PL100 manufactured by Plasmatherm. A one-step undercut process is performed on a batch of partially packaged dies, whereby one die can be undercut by performing a direct isotropic plasma etch for 6–7 minutes, and preferably eight units are undercut at one time by undercutting the batch for approximately 15 minutes.

After the undercut process, the landing electrodes of the micromechanical structures are passivated with an thin anti-adhesion monolayer, such as using PFDA as set forth in commonly assigned U.S. Pat. No. 5,331,454 to Hornbeck, entitled "Low Reset Voltage Process for DMD". This passivation helps avoid the adhesion of the micromirrors when they land upon and attempt to release from the landing electrodes.

In step 48, a lid with a window is hermetically attached to the package to hermetically seal the micromechanical device therewithin. By hermetically sealing the package, moisture is prevented from entering the package. A getter material may be placed within the package to maintain a moisture free environment about the micromechanical device, such as disclosed in commonly assigned U.S. Pat. No. 5,610,438, entitled "Micro-Mechanical Device", the teachings of which are incorporated herein by reference.

At step 50, the completed micromechanical device is tested whereby the devices are screened for defects which may include damaged or stuck mirrors.

A technical advantage of the present invention is that the partially fabricated micromechanical devices are more tolerant of scratches or particles which may be generated during handling, contaminants generated during the sawing process, or the automated pick and place equipment which places the die upon the lead frames. This is because the sacrificial photoresist spacer layers are not removed until the die is attached to the lead frame, after the epoxy cure process, and also after the wire bond process. After the undercutting and passivation process, the only step remaining is to hermetically attach the lid to the package. The present invention utilizes conventional front-end wafer processing to fabricate the micromechanical structure, but whereby the dies are individually packaged on a lead frame and then undercut in batches.

Another technical advantage is that the process is simplified, whereby only one saw step is performed, and no partial-saw steps are required. In addition, only a single passivation process is required after the undercutting plasma etch step. Other simplifications include the elimination of a wafer break process, and a more forgiving die attach process whereby mirrors cannot be damaged by the vacuum pressure.

In summary, the method of the present invention includes fabrication of a micromechanical device by removing the spacer layer beneath the movable microstructure just before the lid is hermetically attached to the package. As illustrated, the spacer layer beneath the micromirror, and the protective layer over the micromirror, remain in place until after the wafer is cut to form the die, after the die are attached to the lead frame, and after the wire bond process is performed. The undercutting and passivation processes are performed at the package level, rather than at the wafer level.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A method of fabricating a micromechanical device, comprising the steps of:
   a) processing a wafer to form a plurality of partially fabricated devices, the devices having a micromechanical structure defined upon a first layer;
   b) subdividing the wafer to separate the partially fabricated devices;
   c) mounting the separated partially fabricated devices on a package with the first layer still in place;
   d) undercutting the first layer from the mounted partially fabricated devices to free the micromechanical structure for movement; and
   e) attaching a lid to the package.

2. The method as specified in claim 1 wherein step d) is performed by a plasma etch process.

3. The method as specified in claim 1 wherein the micromechanical structure comprises a beam and a hinge, the hinge supporting the beam above a well created after undercutting the first layer in step d).

4. The method as specified in claim 1 comprising the step of utilizing photoresist as the first layer.

5. The method as specified in claim 1 further comprising the step of performing a wire bond between the package and the mounted partially fabricated device before step d).

6. The method as specified in claim 1 further comprising the step of passivating the partially fabricated devices after step d) and before step e).

* * * * *